United States Patent [19]

Mendelsohn et al.

[11] 4,126,287

[45] * Nov. 21, 1978

[54] FLEXIBLE ELECTROMAGNETIC SHIELD COMPRISING INTERLACED GLASSY ALLOY FILAMENTS

[75] Inventors: Lewis I. Mendelsohn, Swampscott, Mass.; Ethan A. Nesbitt, Beach Haven, N.J.

[73] Assignee: Allied Chemical Corporation, Morris Township, Morris County, N.J.

[*] Notice: The portion of the term of this patent subsequent to Jun. 21, 1994, has been disclaimed.

[21] Appl. No.: 805,060

[22] Filed: Jun. 9, 1977

Related U.S. Application Data

[63] Continuation-in-part of Ser. No. 663,172, Mar. 2, 1976, Pat. No. 4,030,892.

[51] Int. Cl.² .................................................. B21F 21/00
[52] U.S. Cl. ............................................ 245/8; 75/122; 75/123 B; 75/123 K; 75/126 H; 75/126 P; 75/128 B; 75/128 F; 148/31.55; 428/615; 428/928

[58] Field of Search ..................... 428/226, 606–607, 428/611, 630, 615, 605, 928; 148/121, 31.55, 120, 100; 75/122, 123 B, 123 K, 123 D, 123 C, 170, 126, 128; 335/214, 296, 301; 66/202; 245/1, 8

[56] References Cited

U.S. PATENT DOCUMENTS

| | | | |
|---|---|---|---|
| 2,234,038 | 3/1941 | Bedford et al. | 335/214 |
| 3,427,154 | 2/1969 | Mader et al. | 148/31.55 |
| 3,756,788 | 9/1973 | Whetstone | 428/226 |
| 3,820,040 | 6/1974 | Berry et al. | 331/156 |
| 3,845,805 | 11/1974 | Katesch | 164/89 |
| 3,856,513 | 12/1974 | Chen et al. | 75/122 |
| 4,030,892 | 6/1977 | Mendelsohn et al. | 428/226 |
| 4,053,331 | 10/1977 | Graham et al. | 148/120 |
| 4,053,332 | 10/1977 | Egami et al. | 148/120 |
| 4,053,333 | 10/1977 | Egami et al. | 148/120 |
| 4,056,411 | 11/1977 | Chen et al. | 148/121 |

*Primary Examiner*—Arthur J. Steiner
*Attorney, Agent, or Firm*—Horst M. Kasper; David W. Collins

[57] ABSTRACT

A flexible electromagnetic shield is provided. The shield comprises interlaced filaments of at least one glassy metal alloy. The glassy alloy has a maximum permeability of at least about 25,000 and a coercivity of less than about 0.08 Oe.

17 Claims, 4 Drawing Figures

FLEXIBLE ELECTROMAGNETIC SHIELD COMPRISING INTERLACED GLASSY ALLOY FILAMENTS

This application is a continuation-in-part application of Ser. No. 663,172, filed Mar. 2, 1976, now U.S. Pat. No. 4,030,892, issued June 21, 1977.

BACKGROUND OF THE INVENTION

1. Field of the Invention

This invention relates to electromagnetic shields for minimizing electromagnetic fields which interfere with the operation of electrical and magnetic devices.

2. Description of the Prior Art

Electromagnetic shields are used for minimizing and reducing to substantially zero electromagnetic fields which interfere with the operation of electrical and magnetic devices. For example, in color television receivers, the electron beam of the picture tube generally requires shielding from interference by 60 Hz fields produced internally by transformers or other electrical components. Shielding is also required fron interference by external equipment, such as permanent magnets and electromagnets, since these also may adversely affect picture quality. Similarly, magnetic tape used in computers as well as for recording sound must also be shielded from stray fields.

Presently, such shielding usually consists of punched and drawn stampings from crystalline alloys. For example, where high permeability is required, alloys such as the 80/20 nickel-iron series (sold under the designation Mumetal, Hymu 80, Moly Permalloy) or the 50/50 nickel-iron series (4750 Alloy, Hipernik) are used. Where high saturation induction at moderate permeability is required, ingot iron or 3% silicon-iron is used.

For example, for protecting instrumentation from the earth's magnetic field, high permeability 80/20 nickel-iron alloy shields will reduce the field to less than one tenth of its original value (about 0.5 gauss in the U.S.A.). These shields are ideal for low field applications. On the other hand, if it should be desired to protect an aircraft compass system from the large stray fields (about 20 to 30 gauss) produced by devices containing permanent magnets, such as d'Arsonval ammeters and voltmeters, magnetrons, magnetic recorders, permanent magnet motors and the like, then ingot iron sheet or silicon-iron sheet with their higher saturation induction are wrapped around the stray field source to absorb most of the stray flux. If additional shielding is desired, present practice adds a high permeability nickel-iron shield about ¼ inch away from the ingot iron to further reduce the field to extremely low values.

The shielding materials commonly employed in commercial practice suffer from several major drawbacks. First, all alloys must be heat treated, usually in pure dry hydrogen, at temperatures above 800° C. to achieve optimum magnetic properties. Second, after this costly annealing, any slight bending strain will substantially lower the maximum permeability. Further, when these crystalline materials are formed into complex shapes, they must be reannnealed at elevated temperatures to regain their outstanding magnetic properties. However, such reannealing does not permit close dimensional tolerances to be maintained. As a consequence, flexible shields having desirable magnetic properties are not readily available.

SUMMARY OF THE INVENTION

In accordance with the invention, a flexible electromagnetic shield is provided, together with a process for making the shield. The flexible electromagnetic shield of the invention comprises interlaced filaments of at least one metal alloy which is primarily glassy and has a maximum permeability of at least about 25,000 and a coercivity of less than about 0.08 Oe. The glassy metal alloy consists essentially of about 75 to 87 atom percent of at least one metal selected from the group consisting of iron and cobalt, up to about three-fourths of which may be replaced by nickel, and the balance at least one metalloid selected from the group consisting of boron, carbon and phosphorus, up to about one-third of which may be replaced by at least one element selected from the group consisting of silicon and aluminum, plus incidental impurities.

DETAILED DESCRIPTION OF THE INVENTION

Figure 1:
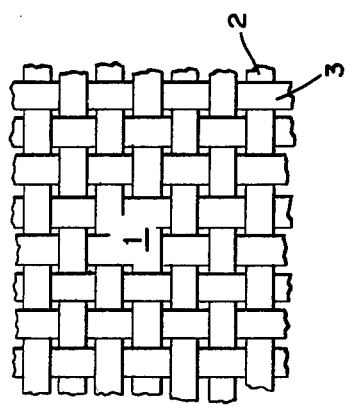
FIG. 1 is a detailed plan view of flexible electromagnetic shielding fabric, showing a typical pattern comprising interlaced filaments.

A flexible electromagnetic shield is provided which comprises interlaced filaments of at least one metal alloy that is primarily glassy and has a maximum permeability of at least about 25,000 and a coercivity of less than about 0.08 Oe.

The glassy metal alloys employed in the invention consist essentially of about 75 to 87 atom percent of at least one metal selected from the group consisting of iron and cobalt, up to about three-fourths of which may be replaced by nickel, and the balance at least one metalloid selected from the group consisting of boron, carbon and phosphorus, up to about one-third of which may be replaced by at least one element selected from the group consisting of silicon and aluminum, plus incidental impurities. The partial replacement of iron and/or cobalt by nickel is made in order to obtain higher permeability values. The partial replacement of the metalloid elements is made in order to aid formation of the glassy filament during casting from the molten state.

The replacement by nickel of more than about three-fourths of the total amount of iron and/or cobalt tends to reduce the residual induction and hence the flux carrying capacity to unacceptably low levels. A perferred maximum replacement by nickel is about three-fifths of the total amount of iron and/or cobalt to maintain a reasonably high flux carrying capacity.

The replacement by silicon and/or aluminum of more than about one-third of the total amount of boron, carbon and/or phosphorus tends to interfere with formation of glassy filaments from the molten state, such as by forming obstructing residues in the casting apparatus. A preferred maximum replacement by silicon and/or aluminum is about one-fifth of the total amount of boron, carbon and/or phosphorus.

The glassy metal alloys employed in the invention include, without the partial replacement of metals and metalloids, compositions consisting essentially of about 75 to 87 atom percent of at least one of iron and cobalt and the balance at least one of boron, carbon and phosphorus. Examples include the following nominal compositions: $Fe_{80}B_{20}$, $Fe_{86}B_{14}$, $Co_{74}Fe_6B_{20}$, $Fe_{64}Co_{16}B_{20}$ and $Fe_{69}Co_{18}B_{13}$ (the subscripts are in atom percent). The glassy metal alloys employed in the invention also include, with maximum partial replacement of both metal and metalloid elements, compositions consisting essentially of about 19 to 22 atom percent of at least one of iron and cobalt, about 56 to 65 atom percent of nickel, about 9 to 17 atom percent of at least one of boron, carbon and phosphorus and about 4 to 8 atom percent of at least one of silicon and aluminum. Compositions intermediate the minimum and maximum replacement ranges, such as $Fe_{40}Ni_{40}P_{14}B_6$, $Ni_{50}Fe_{30}B_{20}$ and $Ni_{49}Fe_{29}P_{14}B_6Si_2$, are also included.

Up to about 10 atom percent of iron and/or cobalt may also be replaced by other transition metal elements which commonly alloy with iron and cobalt without deleteriously affecting the desirable magnetic and mechanical properties of the glassy metal alloys employed in the invention. Such replacement is made in order to obtain enhancement of specific properties, such as hardness, corrosion resistance and the like. Examples of such transistion metal elements include chromium, molybdenum, copper, manganese, vanadium, niobium, tantalum and tungsten. Examples of glassy alloys suitably employed in the invention include the following nominal compositions: $Fe_{63}Co_{15}Mo_2B_{20}$, $Fe_{40}Ni_{38}Mo_4B_{18}$, $Fe_{71}Mo_9C_{18}B_2$, $Fe_{37}Ni_{37}Cr_4B_{22}$ and $Fe_{67}Ni_{10}Cr_3B_{20}$.

It will be appreciated that the constituent elements of nominal compositions may be varied a few atom percent without substantial change in properties. The purity of all compositions is that found in normal commercial practice.

At a given field strength, the higher the permeability, the greater the effectiveness of a magnetic shield. A maximum permeability, $\mu_{max}$, of at least about 25,000 is considered necessary to develop useful shielding. A low coercive force, $H_c$, is desirable, since the operating permeability increases with increasing field strength. A coercive force of less than about 0.08 Oe is considered necessary to permit the operating permeability to be attained quickly. Since, to a first approximation, $$\mu_{max} = B_r/H_c$$

where $B_r$ is the residual induction, then the value of the residual induction can be determined. For $\mu_{max} = 25,000$ and $H_c = 0.08$ Oe, then $B_r = 2,000$ Gauss. The higher this value, the greater the flux that can be drawn into the material, and hence the greater the magnetic shielding ability of the shield.

Preferably, the maximum permeability is at least 100,000 and the coercive force is less than about 0.04 Oe. Such values, which may be achieved by proper selection of alloy composition and/or by suitable processing of the flexible electromagnetic shield, desirably increase the shielding ratio.

As employed in this application, interlacing includes operations such as weaving, knitting and braiding. Filaments as used herein may be ribbon or wire or other slender body whose transverse dimensions are much smaller than its length, having regular or irregular cross-section.

The term "glassy," as used herein, means a state of matter in which the component atoms are arranged in a disorderly array; that is, there is no long range order. Such a glassy material gives rise to broad, diffuse diffraction peaks when subjected to electromagnetic radiation having wavelengths in the X-ray region (about 0.01 to 50 Angstrom wavelength). This is in contrast to crystalline material, in which the component atoms are arranged in an orderly array, giving rise to sharp diffraction peaks. Primarily glassy material may include a minor amount of crystalline material. While the alloy is primarily glassy, it is preferred that it be substantially glassy in order to take advantage of the increasing ductility of the filaments with increasing degree of glassiness.

Glassy alloys such as $Fe_{40}Ni_{40}P_{14}B_6$ and $Fe_{80}B_{20}$ have the advantage that they develop their exceptionally high permeability as-quenched during their processing. Details of the processing conditions and procedures to form glassy metal alloys are readily available; see, e.g., U.S. Pat. Nos. 3,856,513 and 3,845,805, issued Dec. 24, 1974 and issued Nov. 5, 1974, respectively.

Table I shows the remarkable as-quenched properties of two glassy alloys suitable for shielding purposes. Also shown in Table I are the improved properties of these glassy alloys resulting from field annealing. In Table I, $B_s(80)$ is the saturation induction at a field of 80 Oe, $\mu_{max}$ is the maximum permeability, B at $\mu_{max}$ is the induction at maximum permeability, $H_c$ is the coercive force and $B_r(O)$ is the residual induction. These glassy alloys, which are conveniently processed according to the teachings of U.S. Pat. No. 3,856,513, in their as-quenched condition can be strained to appreciable stresses, such as to about 10,000 to 15,000 psi, without substantial loss in magnetic properties after the strain is removed. The iron-nickel alloy in Table I is particularly useful for low field applications (less than 1 Gauss) where permeability is desired. The iron alloy in Table I is most suited where high saturation together with high permeability is desired. While Table I gives two examples of alloys suitable in the practice of the invention, it will be appreciated that the other glassy alloys possessing at least the minimum magnetic properties described above are also suitable.

TABLE I

| Alloy (Atom percent) | $B_s(80)$, Gauss | $\mu_{max}$ | B at $\mu_{max}$, Gauss | $H_c$, Oe | $B_r(0)$, Gauss |
|---|---|---|---|---|---|
| $Fe_{40}Ni_{40}P_{14}B_6$ As-quenched | 6,300 | 65,000 | 3,300 | 0.05 | 4,000 |
| $Fe_{40}Ni_{40}P_{14}B_6$ Field Annealed* | 7,700 | 800,000 | 5,600 | 0.007 | 6,000 |
| $Fe_{80}B_{20}$ As-quenched | 15,500 | 102,000 | 8,500 | 0.08 | 8,150 |
| $Fe_{80}B_{20}$ Field Annealed** | 16,800 | 300,000 | 13,000 | 0.04 | 12,300 |

*Annealed at 325° C for 2 hr at 10 Oe in partial vacuum (<1000 μm)
**Annealed at 325° C for 3 hr at 10 Oe in partial vacuum (<1000 μm)

This invention utilizes the yarn-like qualities of the product resulting from the rapid quenching glassy metal process. Continuous round fibers of about 0.004 to 0.010 inch in diameter or continuous ribbon ranging in thickness from 0.0015 to 0.003 inch and in width from 0.070 to 0.150 inch, for example, can be used as yarn for weaving the electromagnetic shielding fabric. Commercial weaving machinery where the longitudinal fibers (warp) are at right angles to the shuttled fibers (woof) which run across the width of the fabric is easily available for manufacturing fabric up to, for example, 60 inches in width. FIG. 1 depicts a portion of flexible electromagnetic shielding fabric 1, illustrating a useful weaving pattern of interlaced filaments, here ribbons, 2 and 3. Wires may be similarly interlaced. Braiding machines for braiding yarn around a flexible tube (of polyethylene, for example) may be used to braid glassy yarn into a continuous tube. Here the yarn fibers are braided at a 45° angle to the length of the tube and approximately at 90° to one another. Knitting machinery is also commercially available and can be used to knit round wire into fabric. Patterns of interlacing can be varied to modify properties of the flexible electromagnetic shield.

All of the processes which comprise interlacing filaments to form a woven fabric lend themselves to producing a flexible electromagnetic shielding material with magnetic properties very similar to those of commercially available crystalline nickel-iron alloys and with mechanical properties superior to those of the commercially available crystalline alloys. The density of interlacing may be as high or as low as desired, so long as the structural integrity of the flexible electromagnetic shield remains unimpaired. The interlacing may be done using filaments of the same metal alloy composition throughout. Alternatively, filaments of more than one composition, whether glassy or not, may be interlaced in various patterns to combine certain desirable properties of each alloy. For example, filaments of a glassy alloy having a high permeability, such as $Fe_{40}Ni_{40}P_{14}B_6$, may be interlaced with filaments of a glassy alloy having a high flux carrying capacity, such as $Fe_{80}B_{20}$.

As stated above, the flexible electromagnetic shield of the invention retains its outstanding magnetic characteristics even after being strained. The ability to control the interlacing pattern permits fabrication of complex geometric shapes without attendant costly annealing steps required for commercial crystalline alloys.

While the as-cast glassy alloy filaments are useful in their processed condition, further processing such as annealing, which includes heat treating in air, inert gas or in a vacuum and/or in a magnetic field, results in substantial improvement of these properties.

While the filaments themselves may be so annealed, it is preferred that the completed shield be annealed. Typically, such heat treating is done at temperatures sufficiently high above the Curie temperature so as to result in atomic rearrangement and relieve strain within a reasonably finite period of time, yet sufficiently below the temperature at which the glassy alloy begins to crystallize so as to avoid formation of undesirable crystallization phases which tend to be brittle. While the Curie temperature and crystallization temperature are unique for each glassy alloy, annealing at a temperature at least about 25° C. above the Curie temperature and at least about 15° C. below the crystallization temperature is generally sufficient to provide improved magnetic properties. The annealing conditions are conveniently maintained for a period of time of up to about 3 hrs.

Where filaments of two different glassy metal alloys are employed, then the annealing temperature selected should desirably be above the Curie temperature of the glassy alloy having the higher Curie temperature and below the crystallization temperature of the glassy alloy having the lower cyrstallization temperature. In cases where these values overlap, judicious selection of the annealing temperature must be made to attain the maximum improvement in magnetic properties possible, consistent with avoiding crystallization of glassy phases.

A slow cooling of about 1° to 10° C./min is desirably employed to cool the material to ambient temperature, although somewhat higher rates may also be employed. A magnetic field may optionally be applied during annealing to induce magnetic anisotropy. Such field is usually applied to the glassy alloy during cooling as the temperature approaches the Curie temperature and is usually maintained until the temperature of the glasy alloy is below the Curie temperature. The magnitude of the applied magnetic field is not critical; however, fields of about 1 to 10 Oe are usually sufficient to create the desired effect.

Also, the glassy alloy filaments can be plated, such as with copper or brass, to improve higher frequency characteristics for eddy current shielding. The plating may be by electro-or electroless deposition, vapor deposition or other similar well-known techniques. The filaments themselves may be plated or, alternatively, the woven fabric may be plated. A thickness of about 0.0001 to 0.001 inch is usually sufficient to provide the desired high frequency shielding.

EXAMPLES

Crystalline Mumetal shielding material is currently readily available as strips about 4-inch wide and about 0.002 inch thick. This material was wound into cylinders which were four inches in length and either one or two inches in diameter. By butting three such crystalline 80/20 nickel-iron (Mumetal) cylinders end to end with a ⅛ inch overlap to achieve an approximate overall length of twelve inches, comparison was made to woven flexible electromagnetic shields of the invention.

Test procedure A346-64 of the American Society for Testing Materials entitled "Alternating Current Magnetic Properties of Laminated Core Specimens" was followed in evaluating the shields. The arrangement of that test procedure was followed in detail with one exception. Since the maximum dimension to be tested was 2 inches in diameter and since only comparative data, as opposed to absolute data were sought, the coil diameters were made 14 inches in diameter, rather than 48 inches. Otherwise the procedure followed that of the ASTM procedure. A 2 kVA variable transformer supplied 60 Hz power. A Hewlett-Packard model 400F AC voltmeter, a Weston No. 1242 digital multimeter and a 5000 series Tektroniz oscilloscope completed the measuring equipment.

Figure 2:
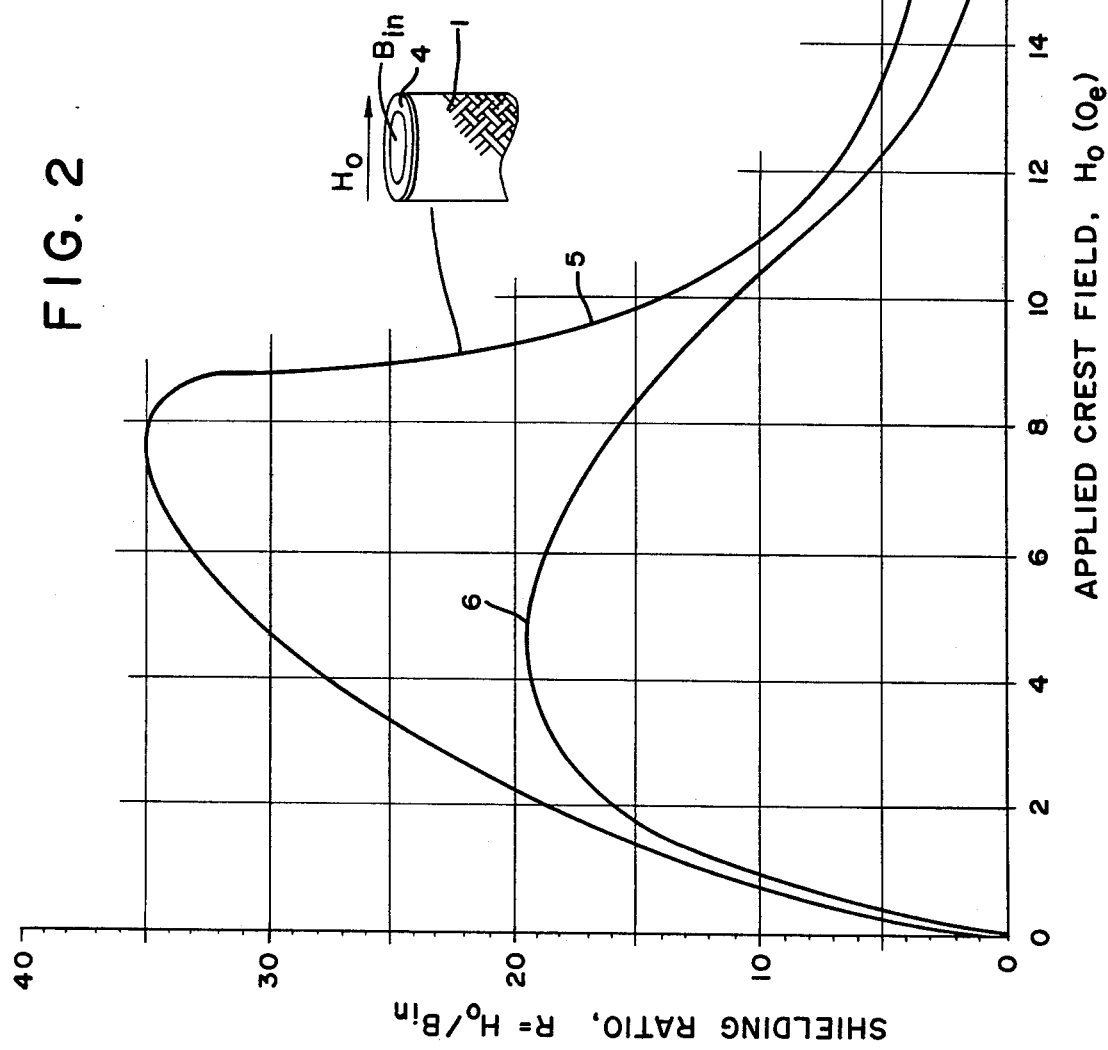
FIG. 2, on coordinates of shielding ratio and applied crest field, is a plot comparing the shielding ratio of a braided cylinder of a flexible electromagnetic shield of the invention, shown in schematic representation, with Mumetel sheet formed into a cylinder.

The Helmholtz coil was calibrated by measuring the field at its center with no shields present ($H_o$). The coils produced a uniform field $H_{cr}$ of 4.0 crest Oe per rms ampere flowing through them in series. $H_o$ was the rms value of $H_{cr}$; in other words, $H_{cr} = \sqrt{2} H_o$. From the ammeter reading, the value of $H_o$ in Oe was determined. The voltage induced in the pick-up coil with no shield present was also recorded and this was called $E_1$. $H_{cr}$ was proportional to $E_1$. A cylindrical shield was inserted between the Helmholtz pair with its long axis parallel to the plane of the Helmholtz pair. A search coil was inserted inside the shield and a voltage $E_2$, which was attenuated below $E_1$, was measured. The voltage $E_2$ was a measure of the induction inside the cylinder, $B_{in}$. The relationship of the cylindrical shield to the applied field is shown in FIG. 2, which includes a schematic representation of a portion of flexible electromagnetic shield fabric of the invention supported on a plexiglas tube. By definition, the ratio of $E_2/E_1$ is the attenuation ratio. Its reciprocal, the ratio $E_1/E_2$, or $H_o/B_{in}$, is called the shielding ratio.

EXAMPLE 1

A flexible electromagnetic shield in the form of a seamless braided fabric was fabricated about 1 inch in diameter by 18 inches long and weighing about 23 g. To compare this braided fabric sample with Mumetal sheet stock, the cylinder was mounted on a plastic tube. A similar cylinder was rolled out of 4 inch wide 0.002 inch thick sheet of nickel-iron 80/20 (Mumetal) onto a 1 inch diameter plastic tube. The sheet was formed into a cylinder which was 1 inch in diameter and 20 inches long, again weighing about 23 g. Braided and sheet stock shields of similar dimensions thus were compared.

FIG. 2 depicts the shielding ratio as a function of applied crest field (curve 5) for a 1 inch diameter, 10 inch long seamless braided cylinder of a flexible shield 1 of the invention mounted on a plexiglass tube 4. The composition of the filaments was glassy $Fe_{40}Ni_{40}P_{14}B_6$. Also shown is the shielding ratio as a function of applied crest field (curve 6) for a 10 inch long, 1 inch diameter tube rolled from 4 inch wide Mumetal sheet with an overlap of 0.86 inch. It is seen that the flexible shield of the invention is superior to the Mumetal shield, which means that at 60 Hz and for field strengths of 20 Oe and below, the permeability of the as-quenched glassy alloy is 1.5 to 2 times that of Mumetal which has been formed and stressed to conform to a 1 inch diameter.

EXAMPLE 2

Weaving permitted fabrication of larger diameter cylinders. A 2 inch diameter seamless cylinder, 9 inch long was woven on a conventional continuous weave loom. A similar cylinder was rolled up out of 12 inch wide flat flexible fabric with about a ¼ inch seam. For evaluating the two woven flexible shields, three pieces of 4 inch wide crystalline sheet nickel-iron alloy (Mumetal) were wrapped to make three cylinders 2 inches in diameter and 4 inches long. These three cylinders were butted or slightly overlapped to form a single cylinder which simulated the woven cylinders. Each of the three cylinders, both the two flexible fabric cylinders, as well as the sheet metal cylinders, weighed about 27 g.

Figure 3:
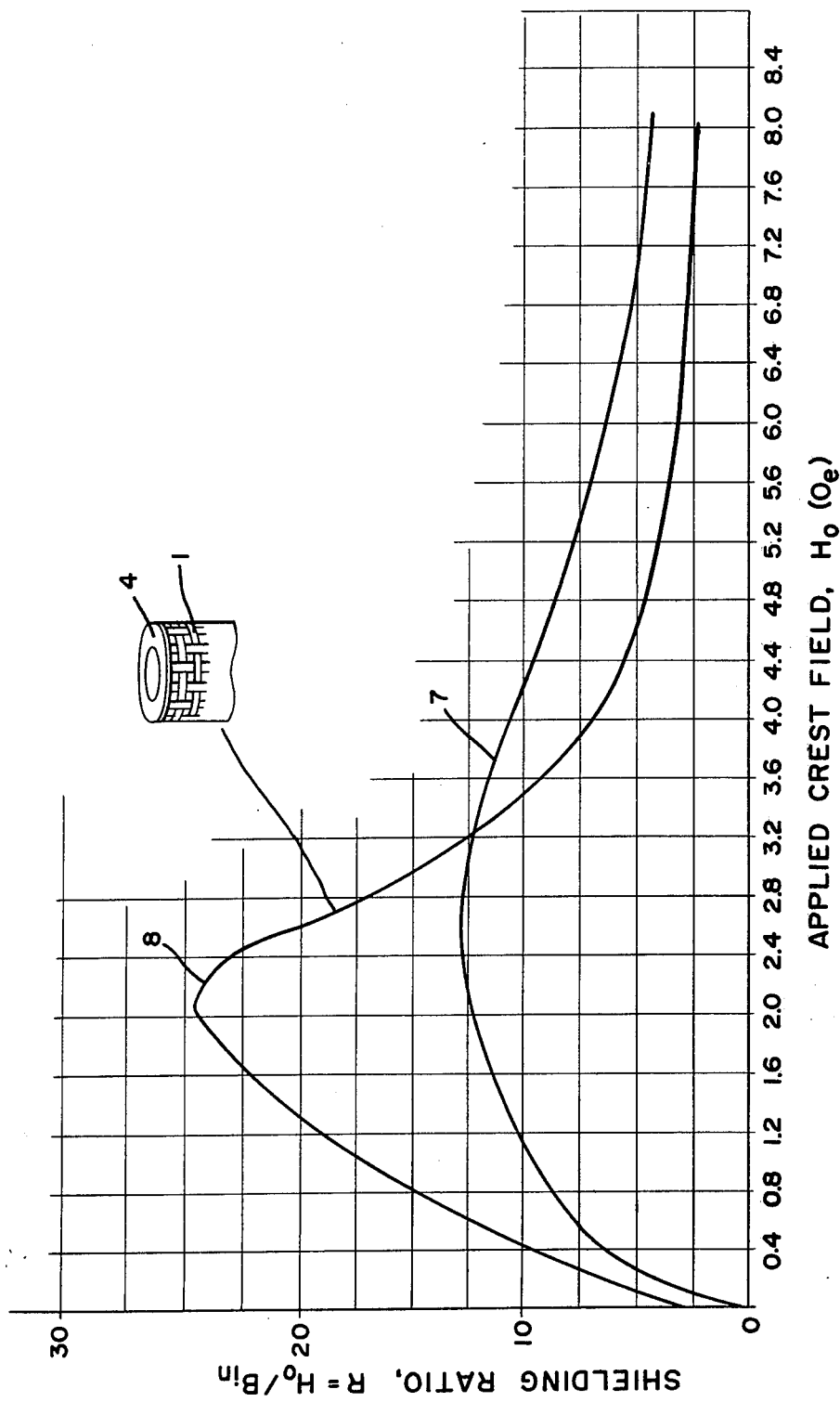
FIG. 3, on coordinates of shielding ratio and applied crest field, is a plot comparing the shielding ratio of a totally woven seamless cylinder of a flexible electromagnetic shield of the invention, shown in schematic representation, with Mumetal sheet formed into a cylinder.

FIG. 3 depicts the shielding ratio as a function of applied crest field (curve 8) for a totally woven cylinder of glassy metal alloy electromagnetic shielding fabric 1 having the composition $Fe_{40}Ni_{40}P_{14}B_6$ mounted on a plexiglass tube 4. Also shown is the shielding ratio as a function of applied crest field (curve 7) for the Mumetal shield described above. The shielding ratios are lower than those of FIG. 2 because larger diameter cavities are more difficult to shield than small ones.

Figure 4:
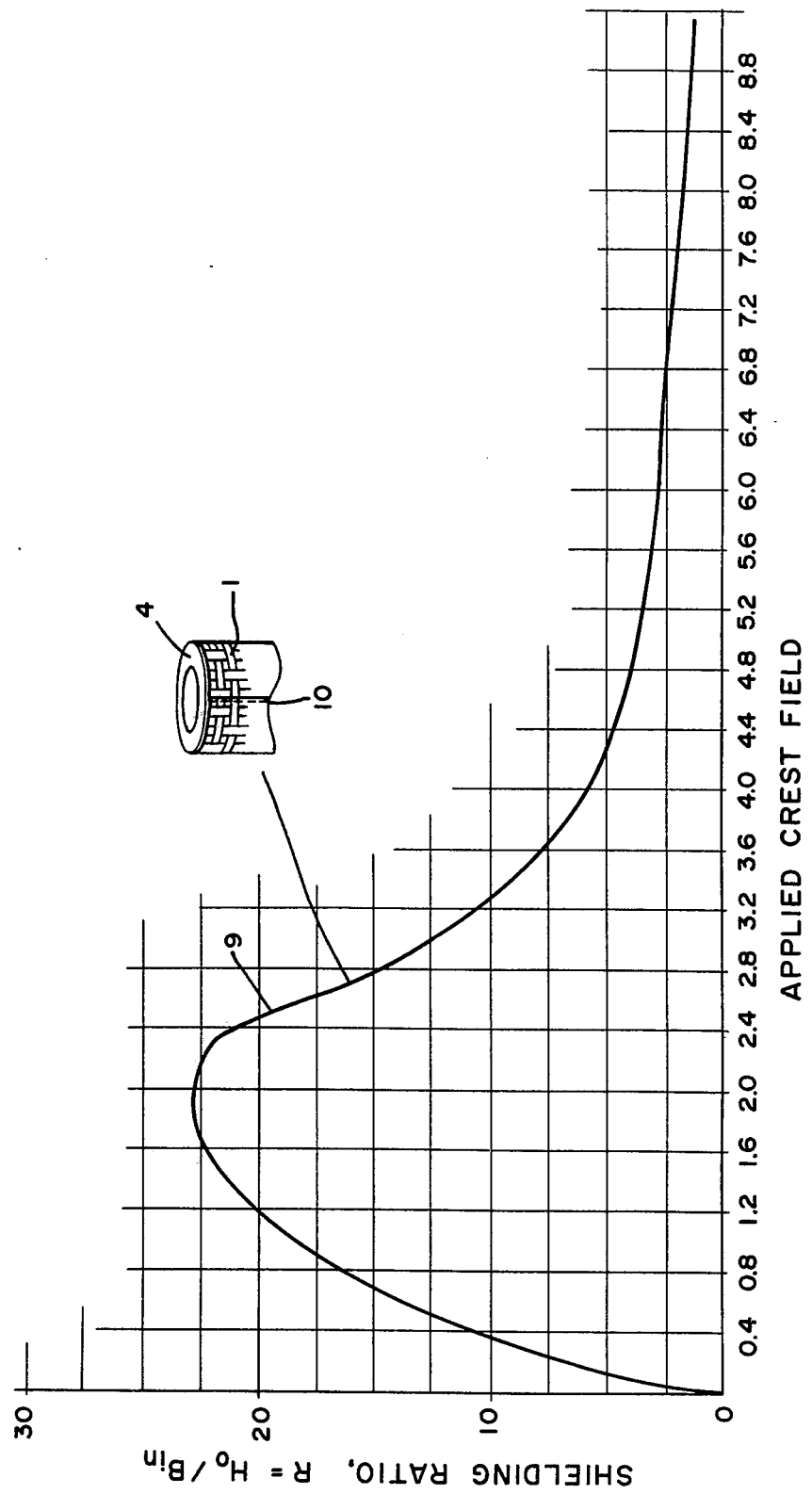
FIG. 4, on coordinates of shielding ratio and applied crest field, is a plot of the shielding ratio of a cylinder fabricated from a woven fabric of a flexible electromagnetic shield of the invention, shown in schematic representation, rolled with an overlap seam to simulate the fully woven cylinder of FIG. 3.

FIG. 4 illustrates the shielding ratio as a function of applied crest field (curve 9) for electromagnetic shielding fabric 1 of the invention which was 2 inches in diameter, 12 inches long which was rolled on a plexiglass tube 4 using flat flexible woven fabric (glassy $Fe_{40}Ni_{40}P_{14}B_6$) with a ¼ inch seam 10 to simulate the fully woven cylinder of FIG. 3. A comparison of the curves of FIGS. 3 and 4 shows very little difference between a fully woven seamless cylinder and one rolled up from woven sheet fabric.

A high shielding ratio, 47.8, was obtained for a flexible electromagnetic shield subjected to a mild heat treatment at 325° C. for 2 hours in a partial vacuum of about 1 μm with a 10 Oe circumferential field applied. This shielding ratio was measured for a 2 inch diameter cylinder of glassy metal alloy fabric having the composition $Fe_{40}Ni_{40}P_{14}B_6$. Heat treatment with a longitudinally applied field or a circumferentially applied field or a combination of the two is expected to further improve the fabric's low field permeability and hence the shielding ratio.

EXAMPLE 3

The magnetic properties of other specific compositions useful in the practice of the invention are listed below in Table II. These properties include the maximum permeability $\mu_{max}$, the coercive force $H_c$ and the residual induction $B_r$. All samples were subjected to field annealing under condition noted in the Table, except the chromium-containing compositions.

TABLE II

| Alloy (atom percent) | $\mu_{max}$ | $H_c$, Oe | $B_r(0)$, Gauss |
|---|---|---|---|
| $Ni_{50}Fe_{30}B_{20}$ (a) | 333,000 | 0.018 | 6,000 |
| $Ni_{49}Fe_{29}P_{14}B_6Si_2$ (b) | 260,000 | 0.008 | 2,000 |
| $Fe_{64}Co_{16}B_{20}$ (c) | 390,000 | 0.04 | 15,500 |
| $Fe_{63}Co_{15}Mo_2B_{20}$ (d) | 200,000 | 0.06 | 12,000 |
| $Fe_{86}B_{14}$ (e) | 120,000 | 0.037 | 8,300 |
| $Fe_{40}Ni_{38}Mo_4B_{18}$ (f) | 770,000 | 0.008 | 8,000 |
| $Fe_{37}Ni_{37}Cr_4B_{22}$ (as-cast) | 42,300 | 0.065 | 2,800 |
| $Fe_{67}Ni_{10}Cr_3B_{20}$ (as-cast) | 72,000 | 0.068 | 4,900 |

Notes:
(a) Annealed 1 hr in partial vacuum of about 30 μm at 290° C and applied field of 10 Oe; slow cooled to room temperature at about 1° C/min.
(b) Annealed 2 hrs in partial vacuum of about 30 μm at 325° C and applied field of 10 Oe; slow cooled to room temperature at about 1° C/min.
(c) Annealed in partial vacuum of about 30 μm at 375° C (no soak) and applied field of 10 Oe; slow cooled to room temperature at about 1° C/min.
(d) Annealed in partial vacuum of about 30 μm at 400° C (no soak) and applied field of 10 Oe; slow cooled to room temperature at about 1° C/min.
(e) Annealed 5 min in partial vacuum of about 20 μm at 300° C and applied field of 20 Oe; slow cooled to room temperature at about 1° C/min.
(f) Annealed 2 hr in argon (1 atm) at 345° C and applied field of 10 Oe; cooled to room temperature at about 20° C/min.

What is claimed is:

1. A flexible electromagnetic shield which comprises interlaced filaments, said filaments comprising at least one metal alloy that is primarily glassy, said at least one metal alloy consisting essentially of about 75 to 87 atom percent of at least one metal selected from the group consisting of iron and cobalt, up to about three-fourths of which may be replaced by nickel, and the balance at least one metalloid selected from the group consisting of boron, carbon and phosphorus, up to about one-third of which may be replaced by at least one element selected from the group consisting of silicon and aluminum, plus incidental impurities, and having a maximum permeability of at least about 25,000 and a coercivity of less than about 0.08 Oe.

2. The flexible electromagnetic shield of claim 1 comprising interlaced filaments of one substantially glassy metal alloy.

3. The flexible electromagnetic shield of claim 1 having a maximum permeability of at least about 100,000 and a coercivity of less than about 0.04 Oe.

4. The flexible electromagnetic shield of claim 1 in which up to about three-fifths of said at least one metal is replaced by nickel.

5. The flexible electromagnetic shield of claim 1 in which up to about one-fifth of said at least one metalloid is replaced by at least one element selected from the group consisting of silicon and aluminum.

6. The flexible electromagnetic shield of claim 1 in which up to about 10 atom percent of said at least one metal is replaced by at least one element selected from the group consisting of chromium, molybdenum, copper, manganese, vanadium, niobium, tantalum and tungsten.

7. The flexible electromagnetic shield of claim 6 in which said at least one element is at least one selected from the group consisting of chromium and molybdenum.

8. The flexible electromagnetic shield of claim 1 in which said at least one metal is at least one selected from the group consisting of iron and cobalt.

9. The flexible electromagnetic shield of claim 1 in which said at least one metalloid is at least one selected from the group consisting of boron, carbon, and phosphorus.

10. The flexible electromagnetic shield of claim 1 in which said at least one metal alloy has a nominal composition selected from the group consisting of $Fe_{40}Ni_{40}P_{14}B_6$, $Fe_{80}B_{20}$, $Ni_{50}Fe_{30}B_{20}$, $Ni_{49}Fe_{29}P_{14}B_6Si_2$, $Fe_{64}Co_{16}B_{20}$, $Fe_{63}Co_{15}Mo_2B_{20}$, $Fe_{86}B_{14}$, $Fe_{40}Ni_{38}Mo_4B_{18}$, $Co_{74}Fe_6B_{20}$, $Fe_{71}Mo_9C_{18}B_2$, $Fe_{69}Co_{18}B_{13}$, $Fe_{37}Ni_{37}Cr_4B_{22}$ and $Fe_{67}Ni_{10}Cr_3B_{20}$.

11. The flexible electromagnetic shield of claim 10 in which said at least one metal alloy has a nominal composition selected from the group consisting of $Fe_{40}Ni_{40}P_{14}B_6$, $Fe_{80}B_{20}$, $Ni_{50}Fe_{30}B_{20}$, $Ni_{49}Fe_{29}P_{14}B_6Si_2$, $Fe_{64}Co_{16}B_{20}$, $Fe_{63}Co_{15}Mo_2B_{20}$, $Fe_{86}B_{14}$, $Fe_{40}Ni_{38}Mo_4B_{18}$, $Fe_{37}Ni_{37}Cr_4B_{22}$ and $Fe_{67}Ni_{10}Cr_3B_{20}$.

12. The flexible electromagnetic shield of claim 11 in which said at least one metal alloy has nominal composition selected from the group consisting of $Fe_{40}Ni_{40}P_{14}B_6$ and $Fe_{80}B_{20}$.

13. The flexible electromagnetic shield of claim 1 comprising interlaced filaments of more than one metal alloy.

14. The flexible electromagnetic shield of claim 13 in which each metal alloy is substantially glassy.

15. The flexible electromagnetic shield of claim 1 annealed at a temperature of at least about 25° C. above the Curie temperature of the glassy metal alloy and at least about 15° C. below its crystallization temperature for a period of time of up to about 3 hrs.

16. The flexible electomagnetic shield of claim 15 in which the annealing additionally includes a magnetic field applied to the shield during cooling through the Curie temperature.

17. The flexible electromagnetic shield of claim 16 in which the applied magnetic field ranges from about 1 to 10 Oe.

* * * * *

UNITED STATES PATENT AND TRADEMARK OFFICE
CERTIFICATE OF CORRECTION

PATENT NO. : 4,126,287
DATED : November 21, 1978
INVENTOR(S) : Lewis I. Mendelsohn, Ethan A. Nesbitt It is certified that error appears in the above-identified patent and that said Letters Patent are hereby corrected as shown below:

Col. 1, line 23 "fron" should read --from-- line 63 "reannnealed" should read --reannealed--

Col. 2, line 29 "Mumetel" should read --Mumetal-- line 67 "per-" should read --pre---

Col. 6, line 19 "glasy" should read --glassy-- line 57 "Tektroniz" should read --Tektronix--

Col. 7, line 28 "plexiglass" should read --plexiglas-- line 59 "plexiglass" should read --plexiglas-- line 68 "glass" should read --glas--

Col. 8, line 25 "condition" should read --conditions--

Col. 10, line 23 "electomagnetic" should read --electromagnetic--

Signed and Sealed this

Thirteenth Day of January 1981

[SEAL]

Attest:

SIDNEY A. DIAMOND

Attesting Officer    Commissioner of Patents and Trademarks